(12) United States Patent
Asako

(10) Patent No.: US 10,651,842 B2
(45) Date of Patent: May 12, 2020

(54) DRIVE CIRCUIT FOR OBJECT SWITCH

(71) Applicant: DENSO CORPORATION, Kariya, Aichi-pref. (JP)

(72) Inventor: Yosuke Asako, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/287,627

(22) Filed: Feb. 27, 2019

(65) Prior Publication Data

US 2019/0267989 A1    Aug. 29, 2019

(30) Foreign Application Priority Data

Feb. 28, 2018   (JP) .................................. 2018-035761

(51) Int. Cl.
| | | |
|---|---|---|
| *H03K 3/00* | (2006.01) | |
| *H03K 17/687* | (2006.01) | |
| *H02P 27/08* | (2006.01) | |
| *H02P 27/06* | (2006.01) | |
| *H03K 3/012* | (2006.01) | |

(52) U.S. Cl.
CPC ........... *H03K 17/687* (2013.01); *H02P 27/08* (2013.01); *H02P 27/06* (2013.01); *H03K 3/012* (2013.01)

(58) Field of Classification Search
CPC ...... H02J 7/0026; H02J 7/0031; H02J 7/0045; H02J 7/0063
See application file for complete search history.

(56) References Cited

U.S. PATENT DOCUMENTS

2010/0245307 A1*  9/2010  Kimura .................... G09G 3/20
345/206

FOREIGN PATENT DOCUMENTS

JP         2017-55259 A       3/2017

* cited by examiner

*Primary Examiner* — Sibin Chen
(74) *Attorney, Agent, or Firm* — Oliff PLC

(57) ABSTRACT

A drive circuit is provided for driving a plurality of object switches mutually connected in parallel. The drive circuit includes: an off holding switch provided for each of the object switches, short-circuiting between a control terminal of each object switch and a reference potential unit to which discharge from the control terminal is discharged; and off control units each provided for the off holding switch. The off holding switch is driven by an own control unit and other control units. The own control unit is provided as an off control unit corresponding to own off holding switch, among the off control units. Other control units are at least one of the off control units other than the own control unit.

3 Claims, 10 Drawing Sheets

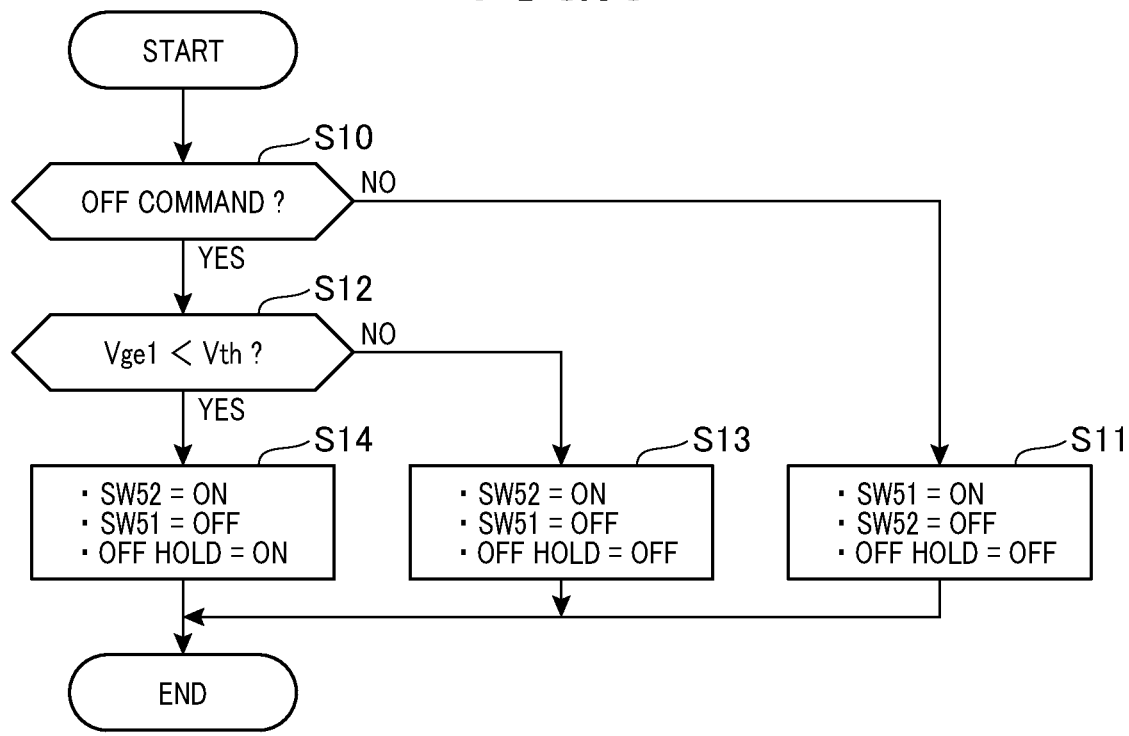
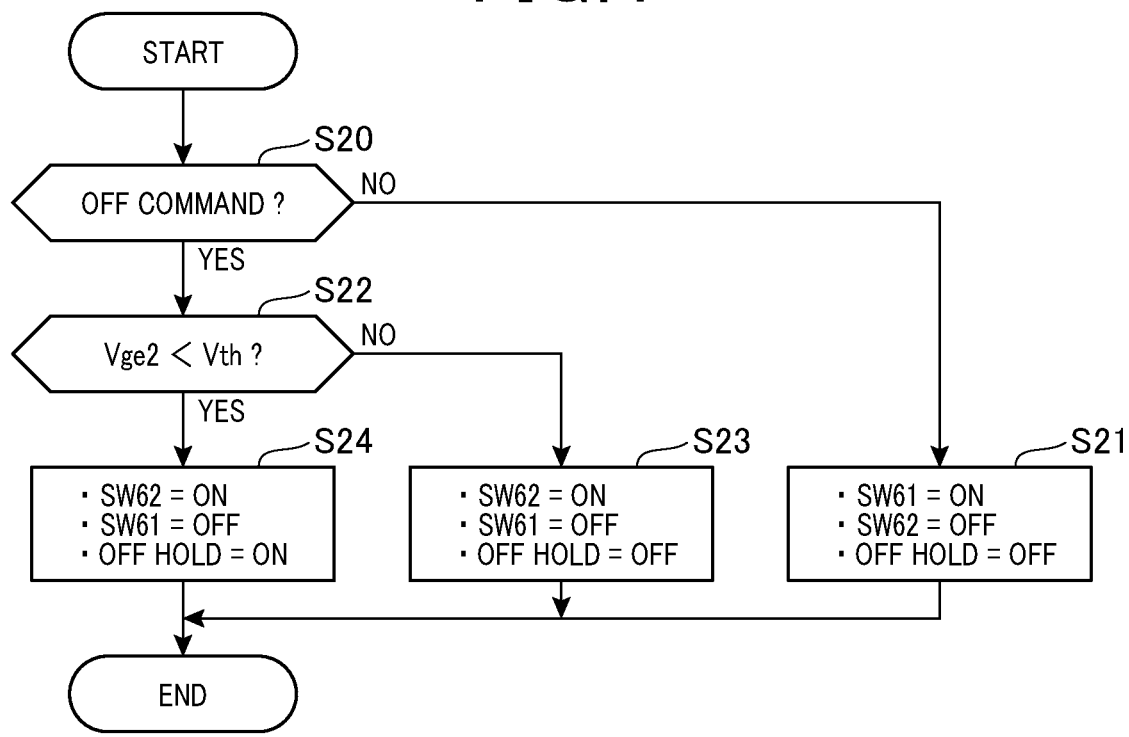

DRIVE CIRCUIT FOR OBJECT SWITCH

CROSS-REFERENCE TO RELATED APPLICATION

This application is based on and claims the benefit of priority from earlier Japanese Patent Application No. 2018-35761 filed Feb. 28, 2018, the description of which is incorporated herein by reference.

BACKGROUND

Technical Field

The present disclosure relates to a drive circuit for driving a plurality of object switches mutually connected in parallel.

Description of Related Art

Conventionally, as disclosed in JP-A-2017-55259, a drive circuit for driving a plurality of object switches which are mutually connected in parallel is known.

Even though the object switches should be maintained in the OFF state, it is possible that the drive circuit may drive the object switches to be the ON state. In order to avoid this phenomenon, the drive circuit includes OFF holding switches and an off control unit. The off holding switches are provided corresponding to each of the object switches mutually connected in parallel, and the off control unit drives each of the off holding switches. The off holding switches are used to short-circuit between the control terminal of the object switch and the reference potential unit to which the discharge from the control terminal is discharged. In the case where a fault occurs in the off control unit, there is a concern that a malfunction may occur in the off holding switches provided corresponding to each of the object switches.

SUMMARY

The present disclosure has been achieved in light of the above-described circumstances, and provides a drive circuit of an object switch capable of suppressing occurrence of malfunction of the off holding switches provided corresponding to the respective object switches mutually connected in parallel.

The present disclosure is provided with a drive circuit for driving a plurality of object switches mutually connected in parallel. The drive circuit includes: an off holding switch provided for each of the object switches, short-circuiting between a control terminal of each object switch and a reference potential unit to which discharge from the control terminal is discharged; and off control units each provided for the off holding switch. Each off holding switch is driven by an own control unit and other control units. The own control unit is provided as an off control unit corresponding to the own off holding switch, among the off control units. Other control units are at least one of the off control units other than the own control unit.

According to the present disclosure, the off control unit is provided for each off holding switch. Also, each off holding switch is driven by an own control unit and other control units, in which each control unit is provided as an off control unit corresponding to the own off holding switch, among the off control units, and the other control units are at least one of the off control units other than the own control unit. Accordingly, even when a fault occurs in the own control unit, other control unit is able to drive the off holding switch which is the drive object of the own control unit. Therefore, a malfunction of the off holding switch corresponding to respective object switches to be driven can be avoided.

BRIEF DESCRIPTION OF THE DRAWINGS

In the accompanying drawings:

FIG. 3 is a flowchart showing a routine of a first drive IC;

FIG. 4 is a flowchart showing a routine of a second drive IC;

DETAILED DESCRIPTION OF THE PREFERRED EMBODIMENTS

First Embodiment

With reference to the drawings, a first embodiment of the drive circuit according to the present disclosure will be described.

Figure 1:
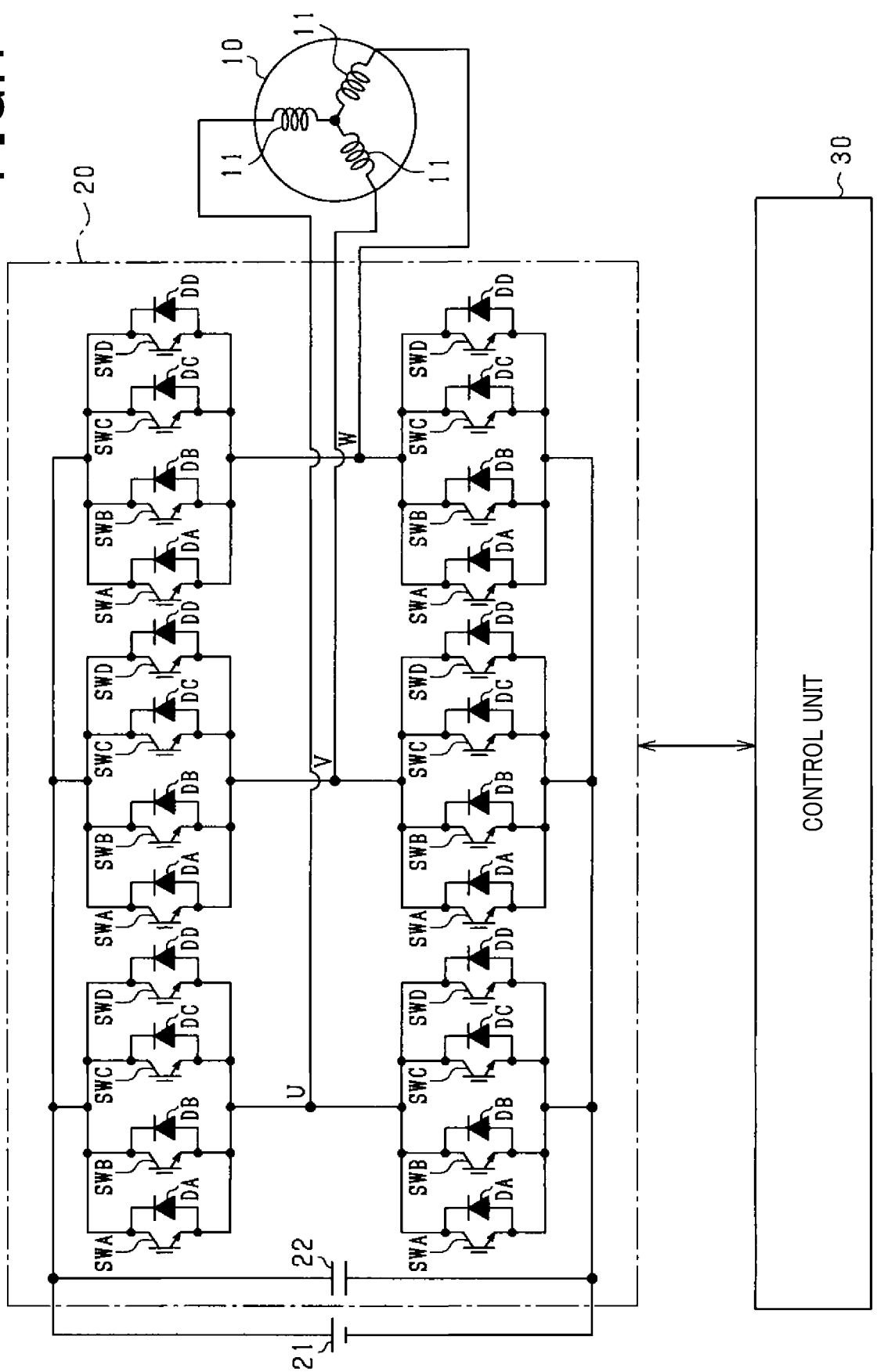
FIG. 1 is an overall configuration of a control system of a rotary electric machine according to a first embodiment of the present disclosure.

As shown in FIG. 1, a control system is provided. The control system includes a rotary electric machine 10, an inverter 20, a battery 21 (storage battery) and a control unit 30. According to the present embodiment, the control system is mounted on a vehicle. The rotary electric machine 10 includes a three-phase winding 11 which is star-connected. The rotor of the rotary electric machine 10 is connected to the drive wheels of the vehicle to be capable of transmitting power to the drive wheels. The rotary electric machine is configured of a synchronous motor, for example.

The rotary electric machine 10 is connected to the battery 21 via the inverter 20. A smoothing capacitor 22 is provided between the battery 21 and the inverter 20. The inverter 20 includes a series connected body including an upper arm switch and a lower arm switch for each of the U/V/W phases. According to the present embodiment, each of the upper arm switch and the lower arm switch is configured of a parallel connected body including a first switch SWA, a second switch SWB, a third switch SWC and a fourth switch SWD. A first, second, third and fourth freewheel diodes DA, DB, DC and DD are connected in reverse parallel to the first, second, third and fourth switches SWA, SWB, SWC and SWD, respectively. In the upper arm switches, at high potential side terminals of the respective switches SWA to SWD, a first end of the smoothing capacitor 22 is connected. In the lower arm switches, at low potential side terminals of the respective switches SWA to SWD, a second end of the smoothing capacitor 22 is connected. At a connection point between the low potential side terminal of each switch in the upper arm switches and the high potential side terminal of each switch in the lower arm switches, a first end of the winding 11 of the rotary electric machine is connected. The second ends of the winding 11 of respective phases are connected at a neutral point. According to the present embodiment, for each of the switches SWA to SWD, an IGBT (insulated gate bipolar transistor) as a Si device is used. Hence, the high potential side terminal of each of the switches SWA to SWD is regarded as a collector and the low potential side terminal of each of the switches SWA to SWD is regarded as an emitter terminal. The gate of the switches SWA to SWD corresponds to a control terminal.

The control unit 30 operates the inverter 20 such that the control amount of the rotary electric machine 10 is the command value thereof. For example, the control amount is a torque. The control unit 30 outputs a drive signal to a drive circuit 40 corresponding to each of the upper and lower arm switches such that the upper switch and the lower arm switch of the inverter 20 are switched with a dead time between the ON periods thereof. The drive signal takes either a ON command or an OFF command where the ON command indicates a turning ON of the switch and the OFF command indicates a turning OFF of the switch.

Figure 2:
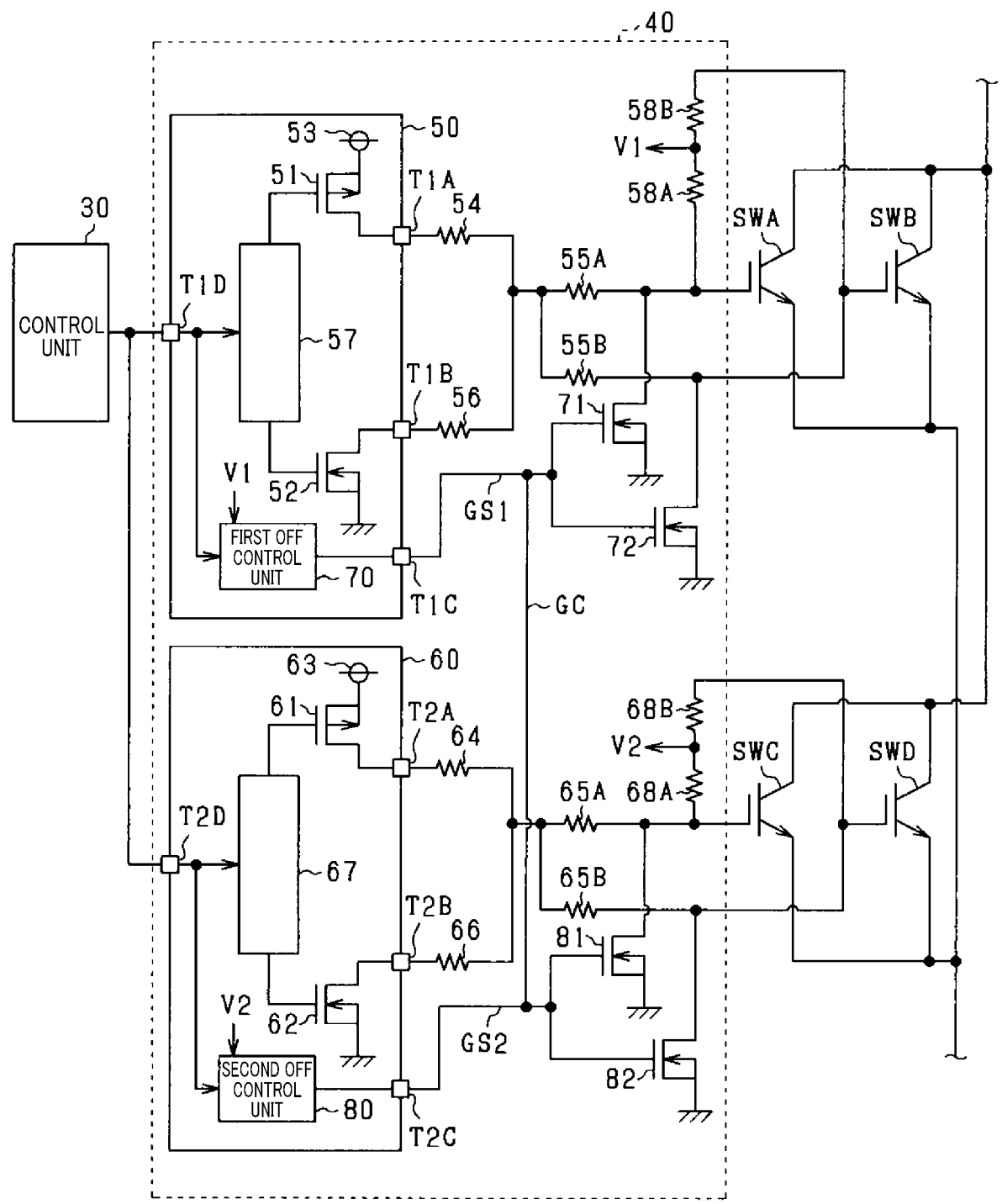
FIG. 2 is a diagram showing a drive circuit.

Subsequently, with reference to FIG. 2, a configuration of the drive circuit 40 will be described.

The drive circuit 40 is provided with a first drive IC 50 and a second drive IC 60. In the first to fourth switches SWA to SWD, the first and second switches SWA, SWB are object switches of the first drive IC 50, and the third and fourth switches SWC, SWD are object switches of the second drive IC 60.

The first drive IC 50 includes a first charge switch 51 and a first discharge switch 52. According to the present embodiment, the first charge switch 51 is a P-channel MOSFET and the first discharge switch 52 is a N-channel MOSFET. A first constant voltage source 53 is connected to the source of the first charge switch 51, and a first A terminal T1A of the first drive IC 50 is connected to the drain of the first charge switch 51. The first charge switch 51 and the first discharge switch 52 are driven by a first drive control unit 57 included in the first drive IC 50.

The drive circuit 40 is provided with a first charge resistor 54, a first A resistor 55A, a first B resistor 55B and a first discharge resistor 56. A first end of the first charge resistor 54 is connected to the first A terminal T1A. At a second end of the first charge resistor 54, a first end of the first A resistor 55A is connected. At a second end of the first A resister 55A, the gate of the first switch SWA is connected. At a second end of the first B resistor 55B, the gate of the second switch SWB is connected. According to the present embodiment, the resistance value of the first A resistor 55A is set to be the same as the resistance value of the first B resistor 55B.

A first end of the first discharge resistor 56 is connected to respective first ends of the first A resistor 55A and the first B resistor 55B. A first B terminal T1B of the first drive IC 50 is connected to a second end of the first discharge resistor 56. The drain of the first discharge switch 52 is connected to the first B terminal T1B. The emitters of the first and second switches SWA and SWB are connected to the source of the first discharge switch 52.

The drive circuit 40 is provided with a first A off holding switch 71 and a first B off holding switch 72. According to the present embodiment, the first 1A and the first 1B off holding switches are constituted of N-channel MOSFETs. The drain of the first A off holding switch 71 is connected to the gate of the first switch SWA. The emitters of the first and second switches SWA and SWB are connected to the source of the first A off holding switch 71. The drain of the first B off holding switch 72 is connected to the gate of the second switch SWB. The emitters of the first and second switches SWA and SWB are connected to the source of the first B off holding switch 72. The first A and first B off holding switches 71 and 72 are driven by a first off control unit 70 included in the first drive IC 50. According to the present embodiment, the emitter to which the sources of the first A and first B off holding switches 71 and 72 are connected corresponds to a reference potential unit.

The second drive IC 60 includes a second charge switch 61 and a second discharge switch 62. According to the present embodiment, the second charge switch 61 is constituted of a P-channel MOSFET, and the second discharge switch 62 is constituted of a N-channel MOSFET. At the source of the second charge switch 61, a second constant voltage source 63 is connected. At the drain of the second charge switch 61, a second A terminal T2A of the second drive IC 60 is connected. The second charge switch 61 and the second discharge switch 62 are driven by a second drive control unit 67 included in the second drive IC 60.

The drive circuit 40 includes a second charge resistor 64, a second A resistor 65A, a second B resistor 65B and a second discharge resistor 66. At the second A terminal T2A, the one end of the second charge resistor 64 is connected. At the second end of the second charge resistor 64, the first end of the second A resistor 65A is connected. At the second end of the second resistor 65A, the gate of the third switch SWC is connected. At the second end of the second resistor 64, the first end of the second B resistor 65B is connected. At the second end of the second B resistor 65B, the gate of the forth switch SWD is connected. According to the present disclosure, the resistance value of the second A resistor 65A is same as the resistor value of the second B resistor 65B.

At the first ends of the second A discharge resistor 65A and the second B resistor 65B, the first end of the second discharge resistor 66 is connected. At the second end of the second discharge resistor 66, the second B terminal T2B is connected. At the second B terminal T2B, the drain of the second discharge switch 62 is connected. At the source of the second discharge switch 62, the emitters of the third and fourth switches SWC and SWD are connected.

The drive circuit 40 includes a second A holding switch 81 and a second B holding switch 82. According to the present embodiment, the second A off holding switch 81 and the second B off holding switch 82 are constituted of MOSFET. At the gate of the third switch SWC, the drain of the second A off holding switch 81 is connected. At the source of the second off holding switch 81, the emitters of the third and fourth switches SWC and SWD. At the gate of the fourth switch SWD, the drain of the second B off holding switch 82 is connected. At the source of the second B off holding switch 82, the emitters of the third and fourth switches SWC and SWD are connected. The second A off holding switch 81 and the second B off holding switch 82 are driven by a second off control unit 80. According to the present embodiment, the emitter to which the sources of the second A holding switch 81 and the second B holding switch 82 are connected, corresponds to the reference potential unit.

The drive circuit 40 includes a first individual signal path GS1, a second individual signal path GS2 and a common signal path GC. The first individual signal path GS1 connects between the gates of the first A and first B off holding switches 71, 72, and the first 1C terminal T1C of the first drive IC 50. The first 1C terminal T1C is connected to the first OFF control unit 70. The second individual signal path GS2 connects between the gates of the second A and second B off holding switches 81, 82, and the second 2C terminal T2C of the second drive IC 60. The second 2C terminal T2C is connected to the second OFF control unit 80. The first individual signal path GS1 and the second individual signal path GS2 are connected by the common signal path GC.

According to this configuration, logical High of the gate signal is outputted at either one of outputs of the first off control unit 70 and the second off control unit 80, whereby the first A and the first B off holding switches 71 and 72, and the second A and the second B off holding switches 81 and 82 turn ON. That is, the first A and first B off holding switches 71 and 72 are driven by the second off holding switch 80 which corresponds to other control unit in addition to the first control unit 70 which corresponds to an own control unit. Also, the second A and second B off holding switches 81 and 82 are driven by the first off control unit 70 which corresponds to other control unit in addition to the second off control unit 80 which corresponds to the own control unit.

The drive circuit 40 is provided with a resistor 58A, a resistor 58B, a resistor 68A and a resistor 68B. According to the present embodiment, the resistance values of the respective resistors 58A, 58B, 68A and 68B are set to the same value. The series connected body of the resistors 58A and 58B connect the gate of the first switch SWA and the gate of the second switch SWB. The first voltage V1 at the connection point between the resistors 58A and 58B is outputted to the first off control unit 70. The series connected body of the resistors 68A and 68B connects the gate of the third switch SWC and the gate of the fourth switch SWD. The second voltage V2 at the connection point between the resistor 68A and 68B is outputted to the second off control unit 80.

According to the present embodiment, a switching timing for turning ON the first to fourth switches SWA to SWD and a switching timing for turning OFF the first to fourth switches SWA to SWD are synchronized. Hence, according to the present embodiment, the first drive control unit 57 and the second drive control unit 67 input a common drive signal generated by the control unit 30. Specifically, the first drive control unit 57 inputs a drive signal through the first D terminal T1D of the first drive IC 50, and the second drive IC 67 inputs a drive signal through the second D terminal T2D of the second drive IC 60. Note that the functions provided by the respective drive control units 57 and 67, the respective off holding units 70 and 80 and the control unit 30 can be achieved by a software program stored in a tangible memory unit and a computer which executes the software program, a hardware unit, or a combination thereof.

FIG. 3 shows a procedure of each process executed by the first drive control unit and the first off control unit 70. This procedure is repeatedly executed at a predetermined control period, for example.

At step S10, the process acquires a drive signal outputted by the control unit 30, and then determines whether the acquired drive signal is OFF command.

When the determination at step S10 is negative, the process determines that the drive signal indicates the ON command, and proceeds to step S11. At step S11, the process controls the first charge switch 51 to be ON and controls the first discharge switch 52 to be OFF. Then, the process outputs the logical Low gate signal from the first 1C terminal T1C. Thus, the respective off holding switches 71, 72, 81 and 82 become the OFF state. BY executing the process at step S11, the gate voltages of the first and second switches SWA and SWB become a threshold voltage Vth or more. As a result, the first and second switches SWA and SWB turn to the ON state from the OFF state.

On the other hand, when the determination at step S10 is YES, the process proceeds to step S12 and calculates the gate voltages Vge1 of the first and second switches SWA and SWB based on the first voltage V1. Then, the process determines whether the calculated gate voltage Vge1 is less than the threshold voltage Vth.

At step S12, when the process determines that the gate voltage Vge1 is the threshold voltage Vth or more, the process proceeds to step S13, turns the first discharge switch ON and turns the first discharge switch 51 OFF. Also, the process outputs the Low level gate signal from the first C terminal T1C. Thus, off holding switches 71, 72, 81 and 82 become the OFF state. According to the process at step S13, the gate voltage at the first and second switches SWA and SWB becomes a voltage less than the threshold voltage Vth. As a result, the first and second switches SWA and SWB changes the state from the ON state to the OFF state.

On the other hand, when the determination at step S12 is YES, the process proceeds to step S14, controls the first discharge switch 52 to be ON and the first charge switch 51 to be OFF. Also, the process outputs the High level gate signal from the first C terminal T1C. Thus, the off holding switches 71, 72, 81 and 82 become the ON state. As a result, the gates of the switches SWA to SWD are shorted to the emitters.

FIG. 4 shows a procedure of each process executed by the second drive control unit 67 and the second off control unit 80. This procedure is repeatedly executed at a predetermined control period, for example.

At step S20, the process acquires the drive signal outputted from the control unit 30, and determines whether the acquired drive signal is an OFF command.

When the determination at step S20 is negative (NO), the process determines the command is an ON command, and proceeds to step S21. At step S21, the process turns the second charge switch 61 ON, and turns the second discharge switch 62 OFF. Also, the process outputs the logical Low gate signal from the second C terminal T2C. Thus, the off holding switches 71, 72, 81 and 82 turn OFF. According to the process at step S21, the gate voltages of the third and fourth switches SWC and SWD are the threshold voltage Vth or more. As a result, the third and fourth switches SWC and SWD change the state from the OFF state to the ON state.

On the other hand, when the determination at step S20 is YES, the process calculates the gate voltages of the third and fourth switches SWC and SWD based on the second voltage V2. Then, the process determines whether the calculated gate voltage Vge2 is less than the threshold Vth. When the determination at step S20 is YES, the process proceeds to step S22 and calculates the gate voltage Vge of the third and fourth switches SWC and SWD. Then, the process determines whether the calculated gate voltage Vge2 is less than the threshold voltage Vth.

At step S22, when the process determines that the gate voltage Vge2 is higher than or equal to the threshold voltage Vth, the process proceeds to step S23, controls the second discharge switch 62 to be ON and the second charge switch 61 to be OFF. Also, the process outputs a logical Low gate signal from the second C terminal T2C. According to the process of the step S23, the gate voltage of the third and fourth switches SWC and SWD become a voltage less than the threshold voltage Vth. As a result, the third and fourth switches SWC and SWD change the state from the ON state to the OFF state.

On the other hand, when the determination result is YES at step S22, the process proceeds to step S24 and turns the second discharge switch 62 ON and turns the second charge switch 61 OFF. Also, the process outputs logical High gate signal from the second C terminal T2C. Thus, the off holding switches 71, 72, 81 and 82 turn ON.

According to the present embodiment, the following effects and advantages are obtained.

The off holding switches 71, 72, 81 and 82 are driven by both of the first and second off control units 70 and 80. Hence, even when a fault occurs in either one of first and second off control units 70 and 80, the other off control unit is able to continue to drive the off holding switches 71, 72, 81 and 82. Thus, occurrence of malfunction in the holding switches 71, 72 81 and 82 can be suppressed.

Second Embodiment

Figure 5:
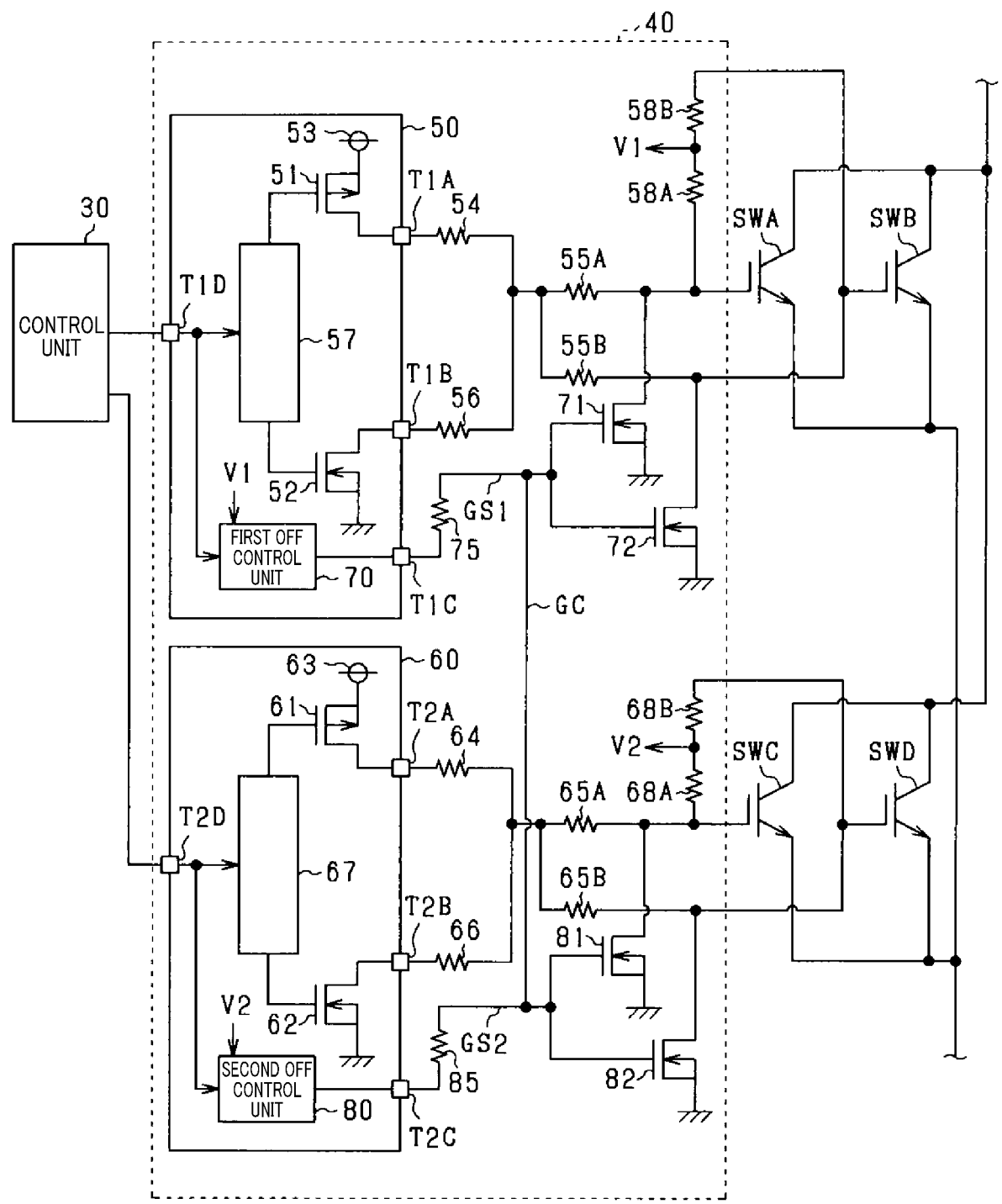
FIG. 5 is a diagram showing a drive circuit according to a second embodiment.

Hereinafter, with reference to the drawings, a second embodiment will be described. In the second embodiment, configurations different from those of the first embodiment will be described. According to the second embodiment, as shown in FIG. 5, the drive circuit 40 is provided with a first resistor 75 and a second resistor 85. In FIG. 5, the same reference numbers are applied to configurations the same as those shown in FIG. 2 or configurations similar to those shown in FIG. 2.

The first resistor 75 is disposed closer to the first C terminal T1C than to the connection point between the first individual signal path GS1 and the common signal path GC. The second resistor 85 is disposed closer to the second C terminal T2C than to the connection point between the second individual signal path GS and the common signal path GC. According to the present embodiment, the resistance value of the first resistor 75 is set to be the same as the resistance value of the second resistor.

Figure 6:
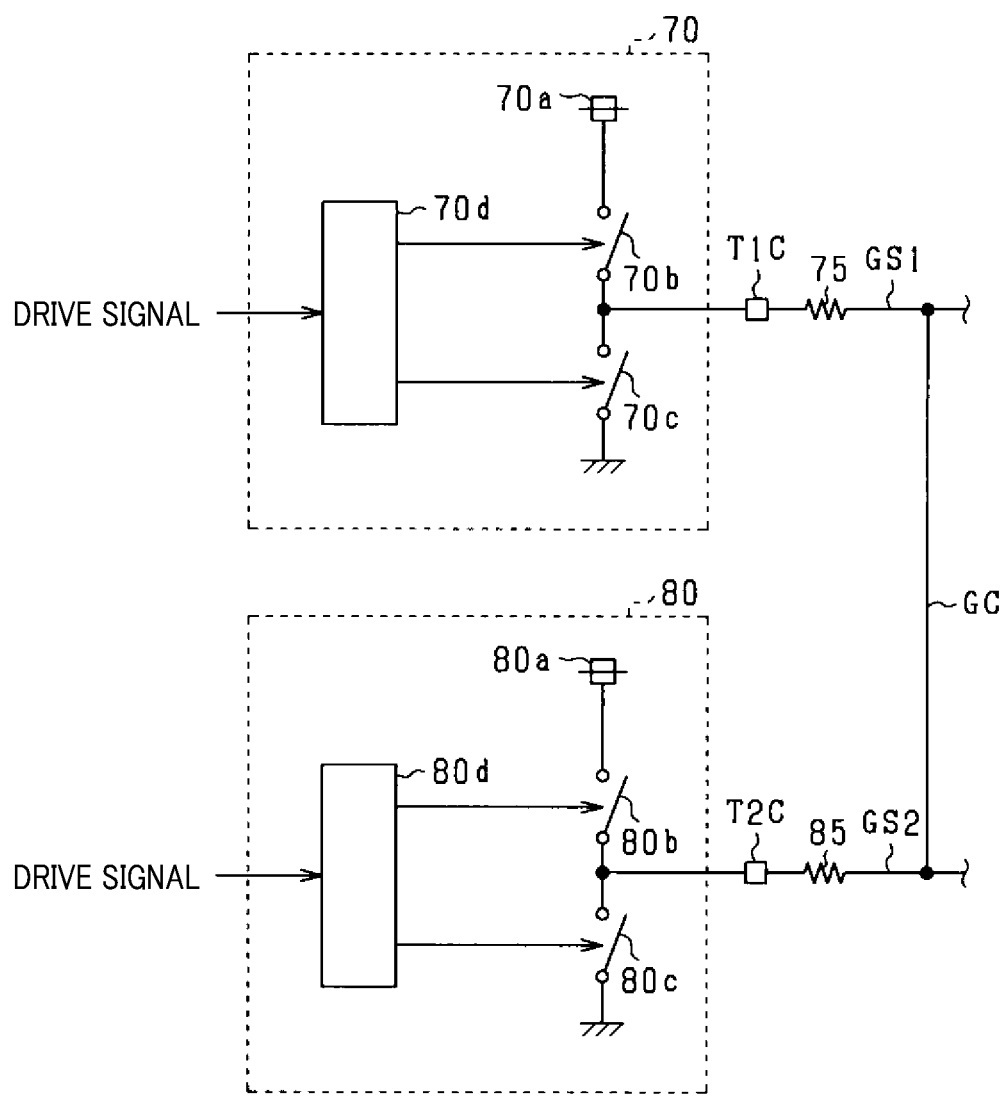
FIG. 6 is a diagram showing a configuration of an off control unit.

In FIG. 6, respective control units 70 and 80, and their periphery configurations are shown.

The first off control unit 70 includes a first power source 70a, a first high side switch 70b, a low side switch 70c and a first processing unit 70d. In the first power source 70a, emitters of the first and second switches SWA and SWB are connected via the first high side switch 70b and the first low side switch 70c. The first C terminal T1C is connected to the connection point between the first high side switch 70b and the first low side switch 70c.

The second off control unit 80 includes a second power source 80a, a second high side switch 80b, a second low side switch 80c, and a second processing unit 80d. The emitters of the third and fourth switches SWC and SWD are connected to the second power source 80a via the second high side switch 80b and the second low side switch 80c. The second C terminal T2C is connected to the connection point between the second high side switch 80b and the second low side switch 80c.

According to the present embodiment, individual drive signal is transmitted to each of the first drive control unit 57 and the second drive control unit 67, from the control unit 30. Specifically, the first control unit 57 inputs the drive signal of the first and second switches SWA and SWB via the first D terminal T1D, and the second drive control unit 67 inputs the drive signals of the third and fourth switches SWC and SWD via the second D terminal T2D.

The first processing unit 70d turns the high side switch ON to turn the first low side switch 70c OFF, when the ON command as the drive signals of the first and second switches SWA and SWB is received. Thus, logical High gate signal is outputted from the first C terminal. Meanwhile, the first processing unit 70d turns the first high side switch 70b OFF and turns the first low side switch 70c ON when the OFF command as the drive signal of the first and second switches SWA and SWB is received. Thus, logical Low gate signal is outputted from the first 1C terminal T1C.

The second processing unit 80d turns the second high switch 80b ON and turns the low side switch 80c OFF, when the ON command as the drive signal of the third and fourth switches SWC and SWD is received. Thus, logical High signal is outputted from the second C terminal T2C. On the other hand, the second processing unit 80d turns the second high side switch 80b OFF and turns the second low side switch 80c ON, when the OFF command as the drive signals of the third and fourth switches SWC and SWD is received. Thus, logical Low signal is outputted from the second C terminal T2C.

According to the present embodiment, the control unit 30 generates the drive signals of the first and second switches SWA and SWB and the drive signals of the third and fourth switches SWC and SWD such that a switching timing of the first and second switches SWA and SWB to be the OFF state and a switching timing of the third and fourth switches SWC and SWD to be the OFF state are shifted from each other. In this case, a timing at which the logic output of the gate signal outputted from the first C terminals T1C changes from Low to High, and a timing at which the logic output of the gate signal outputted from the second C terminal T2C changes from Low to High, are shifted from each other. Hereinafter, a comparative example will be described with an example in which a timing at which the logic of the gate signal outputted from the first C terminal T1C changes to High is earlier than a timing at which the logic of the gate signal outputted from the second C terminal T2C changes to High. The comparative example is a configuration in which the drive circuit 40 does not include the first resistor 75 and the second resistor 85.

According to the comparative example, when the second low side switch 80c is ON, the first C terminal T1C is shorted to the emitters of the first and second switches SWA and SWB. Accordingly, even when the first high side switch 70b is turned ON and the first low side switch 70c is turned OFF, and if the second low side switch 80c is ON, the gate signal outputted from the first C terminal becomes Low even if High output is desired.

In this respect, according to the present embodiment, the first resistor 75 and the second resistor 85 are provided. Hence, the first C terminal T1C is prevented from being shorted to the emitters of the first and second switches SWA and SWB, and the gate signal outputted from the first C terminal T1C is prevented from becoming Low.

Note that the DC voltage outputted from the first power source 70a may be set such that the voltage at common signal path GC side in both ends of the first resistor 75 is higher than or equal to the threshold voltage of the first A and first B off holding switches 71 and 72. Also, the DC voltage outputted from the second power source 80a may be set such that the voltage at common signal path GC side in both ends of the second resistor 85 is higher than or equal to the threshold voltage of the second A and second B off holding switches 81 and 82.

Third Embodiment

Figure 7:
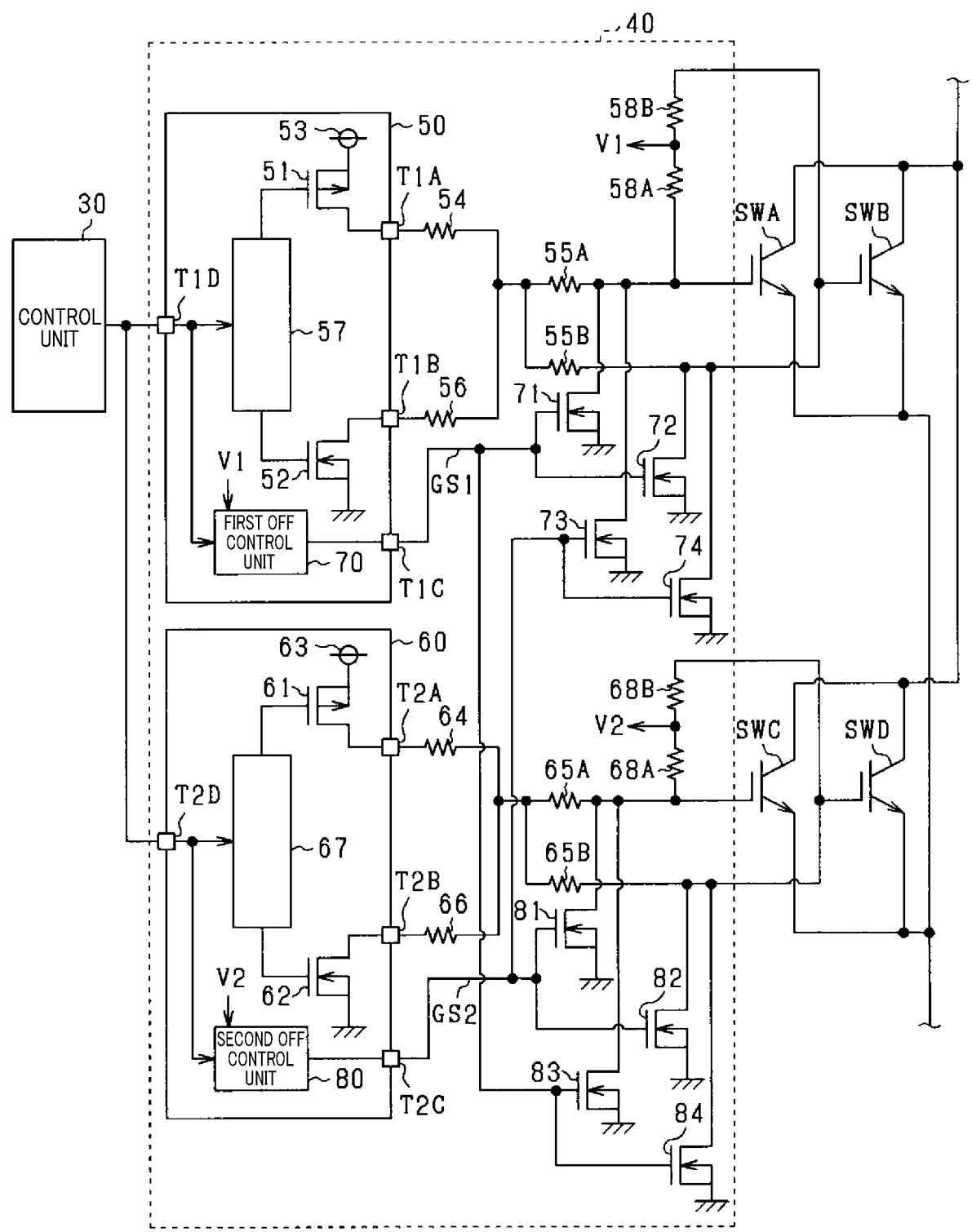
FIG. 7 is a diagram showing a drive circuit according to a third embodiment.

Hereinafter, with reference to the drawings, for the third embodiment, configurations different from those of the first embodiment will be mainly described. According to the present embodiment, as shown in FIG. 7, a plurality of off holding switches are provided corresponding to switches SWA to SWD. In FIG. 7, the same configurations as that of FIG. 2 or configurations similar to that of FIG. 2 will be applied with the same reference numbers.

The drive circuit 40 is provided with a first C off holding switch 73 and a first D off holding switch 74. In the present embodiment, the first C and first D off holding switches 73 and 74 are configured of N-channel MOSFET. The drain of the first C off holding switch is connected to the gate of the first switch SWA. The emitters of the first and second switches SWA and SWB are connected to the source of the first C off holding switch 73. The drain of the first D off holding switch 74 is connected to the gate of the second switch SWB. The emitters of the first and second switches SWA and SWB are connected to the first D off holding switch 74.

The drive circuit 40 is provided with a second C off holding switch 83 and the off holding switch 84. According to the present embodiment, the second C and second D off holding switches are configured of N-channel MOS FET. The drain of the second C off holding switch 83 is connected to the gate of the third switch SWC. The emitters of the third and fourth switches SWC and SWD are connected to the source of the second C off holding switch 83. The drain of the second D off holding switch 84 is connected to the gate of the fourth switch SWD. The emitters of the third and fourth switched SWC and SWD are connected to the source of the second D off holding switch 84.

The first C terminal T1C is connected to the gates of the first A and first B off holding switches 71 and 72 and the second D off holding switches 83 and 84, via the first individual signal path GS1. Thus, the first A and first B off holding switches 71 and 72, and the second off holding switches 83 and 84 are driven by the first off control unit 70.

The second C terminal T2C is connected to the gates of the second A and second B off holding switches 81 and 82, and the first D off holding switches 73 and 74, via the second individual signal path GS2. Thus, the second A and second B off holding switches 81 and 82, and the first C and first F off holding switches 73 and 74 are driven by the second off control unit 80.

As described, according to the present embodiment, two off holding switches are connected to each of the gate of the first to fourth switches SWA to SWD. Moreover, either one off holding switch between two off holding switches is driven by the first off control unit 70, and the other off holding switch is driven by the second off holding switch 80. According to this configuration, similar effects and advantages to those of the first embodiment can be obtained.

Fourth Embodiment

Figure 8:
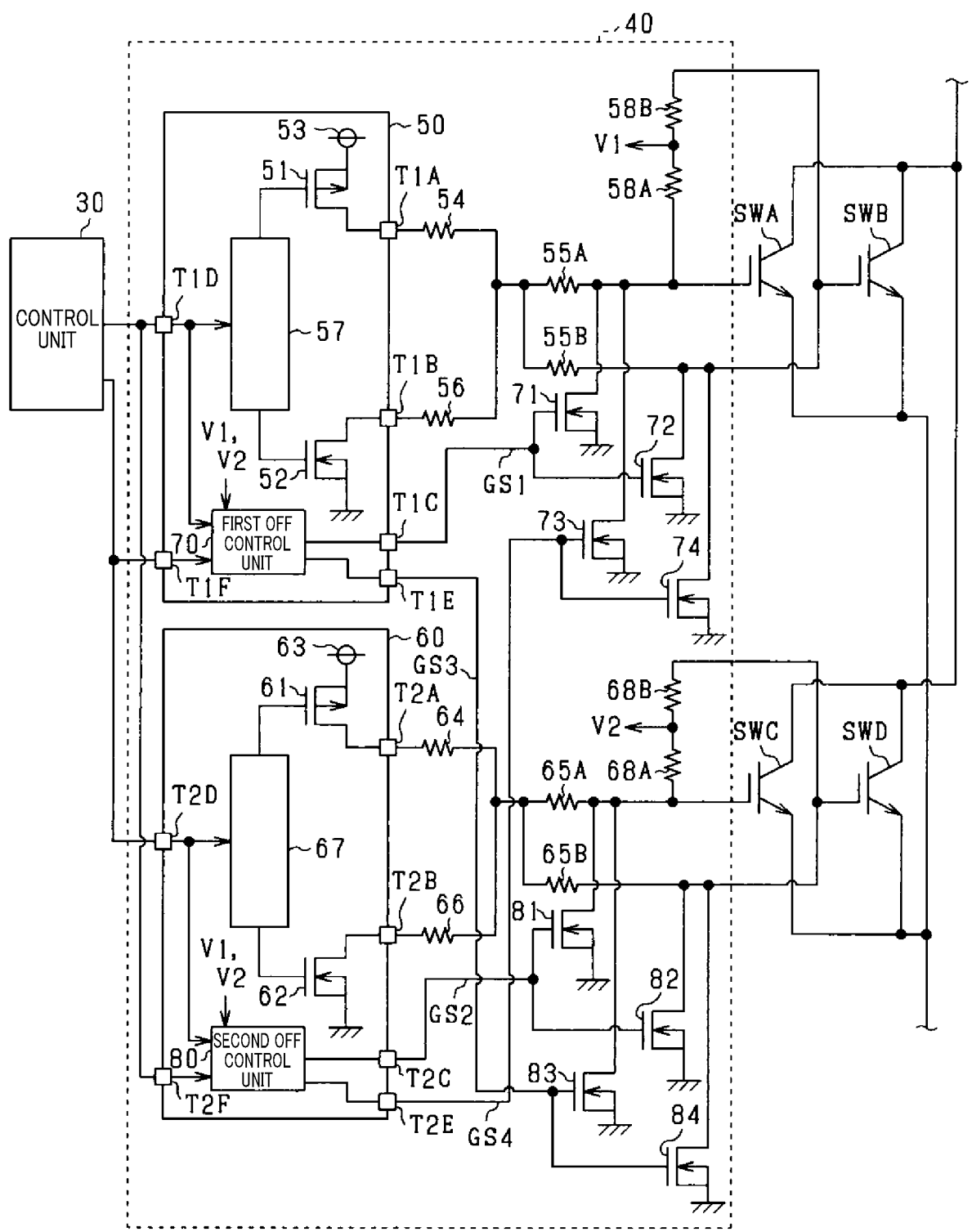
FIG. 8 is a diagram showing a drive circuit according to a fourth embodiment.

Hereinafter, with reference to the drawings, for the fourth embodiment, configurations different from those of the third embodiment will be mainly described. According to the present embodiment, as shown in FIG. 8, individual drive signals are transmitted to the first drive control unit 57 and the second drive control unit 67 from the control unit 30. Accordingly, processes of off control units 70 and 80 are changed. In FIG. 8, the same reference numbers are applied to configurations same as those shown in FIG. 7 or configurations similar to those shown in FIG. 7.

The first C terminal T1C is connected to the gates of the first A and first B off holding switches 71 and 72 via the first individual signal path GS1. Also, a first E terminal T1E of the first drive IC 50 is connected to the gates of the second 2C and second 2D off holding switches 83 and 84 via a third individual signal path GS3. Thus, the first A and first B off holding switches 71 and 72, and the second C and second D off holding switches 83 and 84 are driven by the first off control unit 70.

The second C terminal T2C is connected to the gates of the second A and second B off holding switches 81 and 82 via the second individual signal path GS2. Also, a second E terminal T2E of the second drive IC 60 is connected to the gates of the first 1C and first 1D off holding switches 73 and 74 via a fourth individual signal path GS4. Thus, the second A and second B off holding switches 81 and 82, and the first C and first D off holding switches 73 and 74 are driven by the second off control unit 80.

The first off control unit 70 inputs the drive signal of the third and fourth switches SWC and SWD via the first F terminal T1F. The control unit 80 inputs the drive signals of the first and second switches SWA and SWB via the second F terminal T2F. Also, each the first control unit 70 and the second control unit 80 inputs the first and second voltage V1 and V2 respectively.

Subsequently, processes in the first drive IC 50 will be described.

The first drive control unit 57 and the first off control unit 70 executes processes shown in FIG. 3. Note that the process at step S10 shown in FIG. 3 determines whether the drive signal of the first and second switches SWA and SWB are OFF command. Also, the first off control unit 70 executes processes shown in FIG. 7. These processes are repeatedly executed at a predetermined control period, for example.

At step S30, the process acquires the drive signal of the third and fourth switches SWC and SWD which are outputted from the control unit 30. Then process determines whether the acquired drive signal is OFF command.

At step S30, when the determination result is negative, the process determines it ON command and proceeds to step S31. At step S31, logical Low signal is outputted from the first E terminal T1E. Thus, the second C and second D off holding switches 83 and 84 are in the OFF state.

On the other hand, when the determination result at step S30 is positive, the process proceeds to step S32 and calculates the gate voltage Vge2 of the third and fourth switches SWC and SWD. Then, the process determines whether the calculated gate voltage Vge2 is less than the threshold voltage Vth.

When the process determines that the gate voltage Vge2 is higher than or equal to the threshold voltage Vth, the process proceeds to step S31.

On the other hand, when the determination result at step S32 is positive, the process proceeds to step S33 and outputs logical High gate signal from the first E terminal T1E. Thus, the second C and second D off holding switches 83 and 84 are in the ON state.

Subsequently, processes in the second drive IC 60 will be described.

The second drive control unit 67 and the second off control unit 80 execute processes shown in FIG. 4. Note that the process at step S20 in FIG. 4 determines whether the drive signal of the third and fourth switches SWC and SWD is OFF command. The second off control unit executes processes shown in FIG. 10. These processes are repeatedly executed at a predetermined control period, for example.

At step S40, the process acquires the drive signals of the first and second switches SWA and SWB which are outputted from the control unit 30. Then, the process determines whether the acquired drive signals indicate the OFF command.

When the determination at step S40 is negative, the process determines the ON command and proceeds to step S41. At step S41, logical Low gate signal is outputted from the second E terminal T2E. Thus, the first C and first D off holding switches 73 and 74 are in the OFF state.

On the other hand, when the determination result is positive at step S40, the process proceeds to step S42 and calculates the gate voltages Vge1 of the first and second switches SWA and SWB. Then, the process determines whether the calculated gate voltages Vge1 is less than the threshold voltage Vth.

At step S42, when the process determines that the gate voltage Vge1 is higher than or equal to the threshold voltage Vth, the process proceeds to step S41.

On the other hand, when the determination result at step S42 is positive, the process proceeds to step S43, and outputs logical High gate signal from the second E terminal T2E. Thus, the first C and first D off holding switches 73 and 74 are in the ON state.

According to the present embodiment described above, the off holding switches can be driven continuously even when a fault occurs in either the first off control unit 70 or the second off control unit 80. In particular, advantages of the present embodiment become significant in the case where a switching timing of the first and second switches SWA and SWB to be the OFF state and a switching timing of the third and fourth switches SWC and SWD to be the OFF state are shifted from each other.

Modification of Fourth Embodiment

Figure 9:
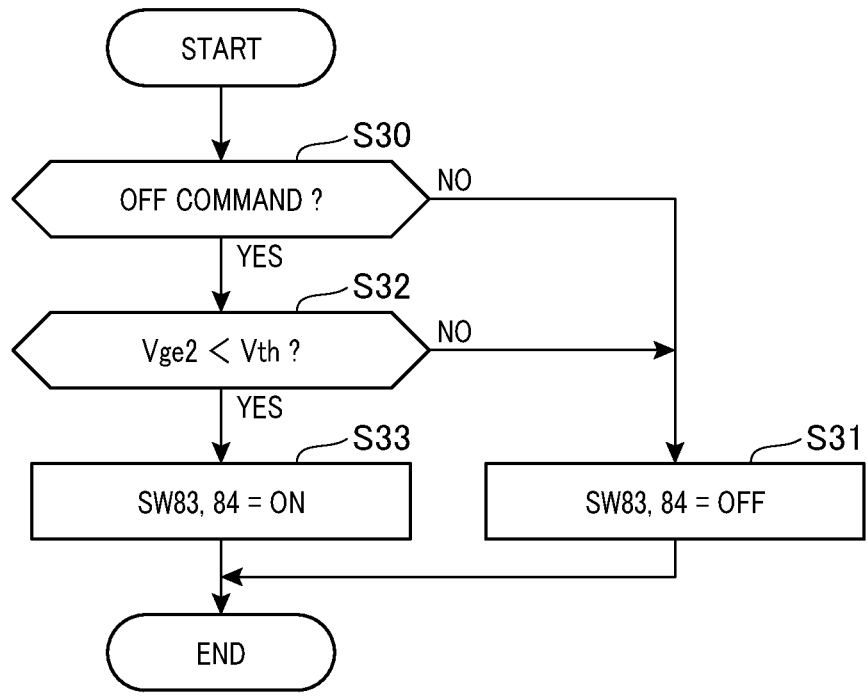
FIG. 9 is a flowchart showing a routine of a first off control unit.
Figure 10:
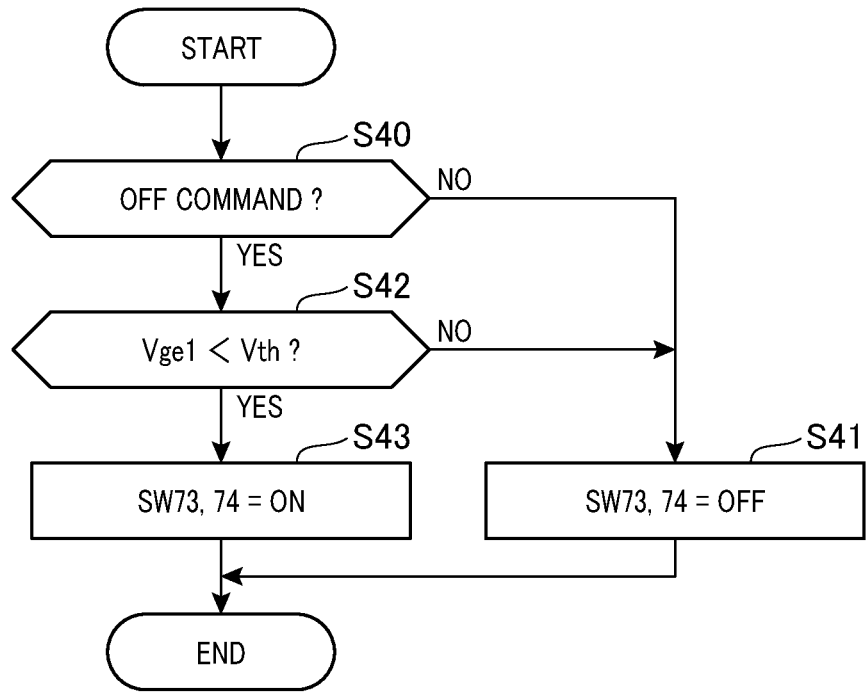
FIG. 10 is a flowchart showing a routine of a second off control unit.

In the case where a switching timing of the first and second switches SWA and SWB to be the OFF state and a switching timing of the third and fourth switches SWC and SWD to be the OFF state are shifted from each other, the process at step S32 shown in FIG. 9 and the process at step S42 shown in FIG. 10 may be replaced by the process that determines whether each of the gate voltages Vge1 and Vge2 is less than the threshold voltage Vth.

Other Embodiments

The above-described embodiments may be modified as follows.

Figure 11:
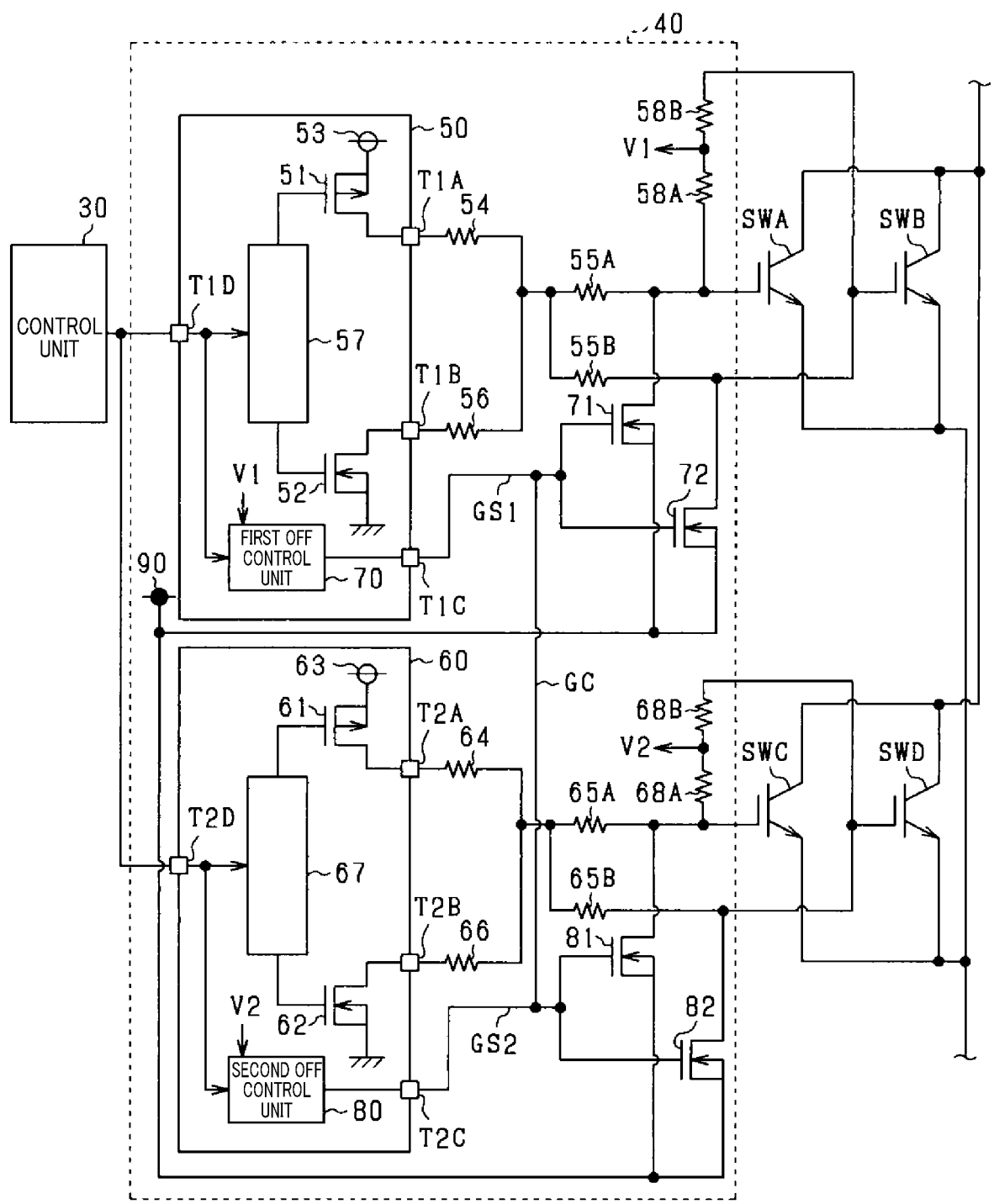
FIG. 11 is a diagram showing a drive circuit according to other embodiments.

As shown in FIG. 11, the drive circuit 40 may be provided with a negative voltage source 90. The negative voltage source 90 corresponds to a reference potential unit, and outputs DC voltage lower than the emitter voltages of the first to forth switches SWA to SWD. The negative voltage source 90 is connected to the sources of the off holding switches 71, 72, 81 and 82. In FIG. 11, the same reference numbers are applied to configurations same as those shown in FIG. 2 or configurations similar to those shown in FIG. 2.

Figure 12:
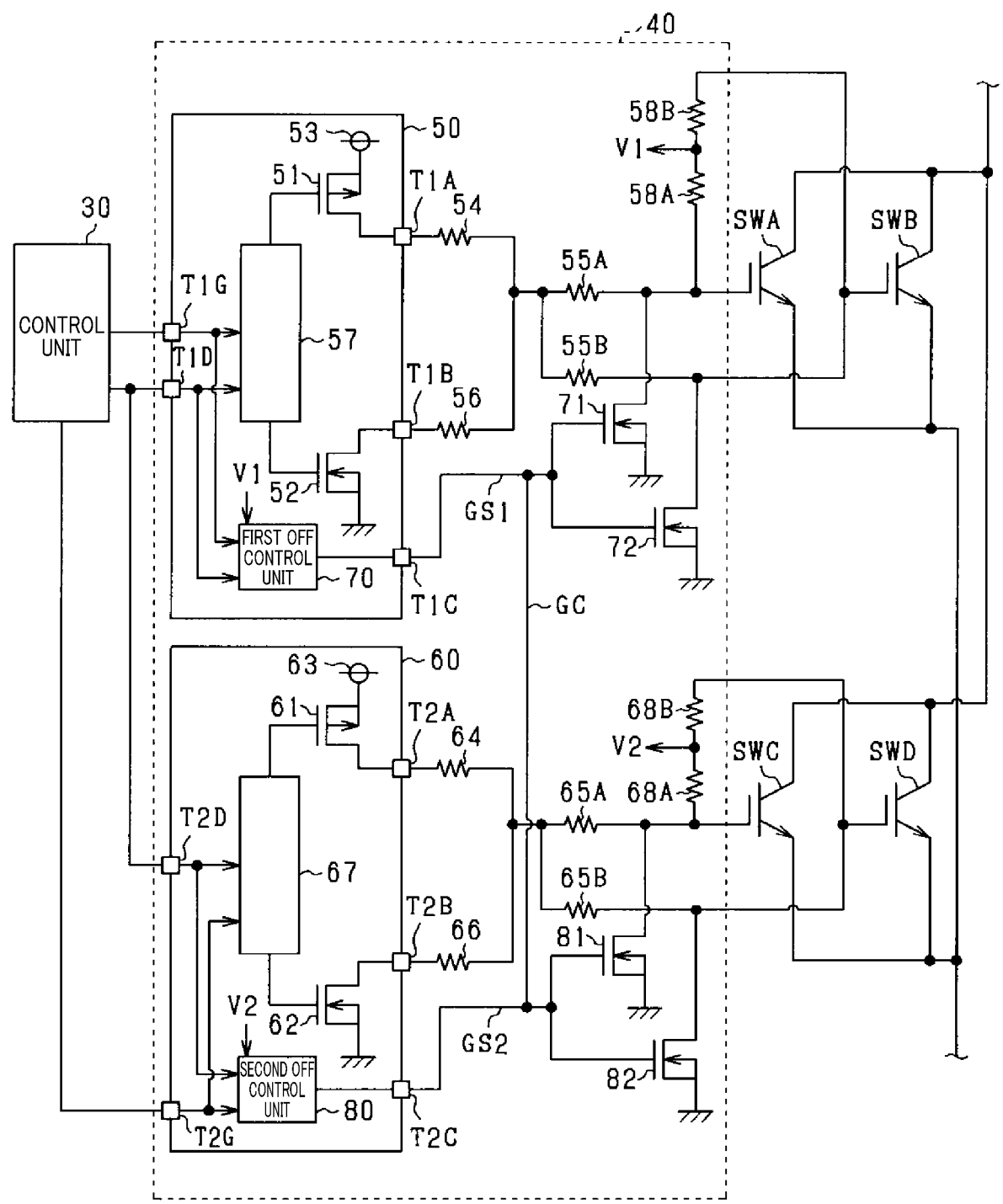
FIG. 12 is a diagram showing a drive circuit according to other embodiments.

A command signal indicating either a command for stopping an operation or a command for reducing a power consumption may be transmitted to the drive control units 57 and 67 and the off control units 70 and 80 from the control unit 30. FIG. 12 illustrates a configuration in which a command signal is transmitted to the first drive control unit 57 and the first off control unit 70 via the first G terminal T1G of the first drive IC 50, and a command signal is transmitted to the first drive control unit 67 and the second off control unit 80 via the second G terminal T2G of the second drive IC 60. In FIG. 12, the same reference numbers are applied to configurations same as those shown in FIG. 2 or configurations similar to those shown in FIG. 2.

The off holding switches are not limited to MOSFETs but bipolar transistors may be used instead. In this case, the base of the bipolar transistor corresponds to the control terminal.

N drive ICs (N>=3) may be provided in a drive circuit 40. In this case, N object switches to be driven are present for a single drive circuit 40. Also, since the off control unit is provided for each drive IC, N off control units are provided for the single drive circuit 40. In this case, the off holding switch connected to the gate of each object switch is not limited to a configuration in which all of N off control units drive the off holding switches, but a configuration may be provided in which at least two off control units drive the off holding switches.

The number of switches connected in parallel which constitute each phase of the inverter 20 is not limited to 4, but may be 2 or 3, or 5 or more.

Note that object switches mutually connected in parallel are not limited to a parallel connected body only using IGBT, but may be a parallel connected body of IGBT and MOSFET.

As a power conversion unit provided with an object switch, it is not limited to an inverter but may be a DC-DC converter.

As a control system, it is not limited to a system mounted on a vehicle.

What is claimed is:

1. A drive circuit for driving a plurality of object switches mutually connected in parallel, the drive circuit comprising:
   a first off holding switch provided for a first object switch, short-circuiting between a control terminal of the first object switch and a reference potential unit to which discharge from the first control terminal of the first object switch is discharged;
   a second off holding switch provided for a second object switch, short-circuiting between a control terminal of the second object switch and the reference potential unit to which discharge from the control terminal of the second object switch is discharged;
   a first off control unit provided for the first off holding switch;
   a second off control unit provided for the second off holding switch;
   a first individual signal path that connects the first off control unit and a control terminal of the first off holding switch;
   a second individual signal path that connects the second off control unit and a control terminal of the second off holding switch;
   a common signal path that connects between the first individual signal path and the second individual signal path;
   a first resistor disposed in the first individual signal path closer to the first off control unit than to a connection point between the first individual path and the common signal path; and
   a second resistor disposed in the second individual signal path closer to the second off control unit than to a connection point between the second individual path and the common signal path,
   wherein the first off holding switch is driven by the first off control unit and the second off control unit.

2. The drive circuit according to claim 1, wherein
   a plurality of off holding switches, including the second off holding switch, is connected to the second object switch; and a portion of the plurality of off holding switches is driven by the first off control unit, and a remainder of the plurality of off holding switches is driven by the second off control unit.

3. The drive circuit according to claim 2, wherein
the first off control unit drives the portion of the plurality of off holding switches based on a drive signal of the object switch received by the first off control unit, and
the second off control unit drives the remainder of the plurality of off holding switches based on a drive signal of the object switch received by the second off control unit.

* * * * *